(12) United States Patent
Shin

(10) Patent No.: US 7,477,315 B2
(45) Date of Patent: Jan. 13, 2009

(54) POP-UP CAMERA MODULE AND MOBILE PHONE INCLUDING THE SAME

(75) Inventor: Sung-jin Shin, Seoul (KR)

(73) Assignee: Samsung Techwin Co., Ltd., Changwon (KR)

( * ) Notice: Subject to any disclaimer, the term of this patent is extended or adjusted under 35 U.S.C. 154(b) by 802 days.

(21) Appl. No.: 11/047,102

(22) Filed: Jan. 31, 2005

(65) Prior Publication Data
US 2006/0033832 A1 Feb. 16, 2006

(30) Foreign Application Priority Data
Jul. 29, 2004 (KR) ...................... 10-2004-0059511

(51) Int. Cl.
*H04N 5/225* (2006.01)
(52) U.S. Cl. .................... 348/373; 348/552; 455/556.1; 455/575.1
(58) Field of Classification Search ................. 348/373, 348/374, 375, 376, 14.02, 552; 379/429, 379/433.13; 439/77; 455/556.1, 575.1, 575.3
See application file for complete search history.

(56) References Cited

U.S. PATENT DOCUMENTS

| | | | | |
|---|---|---|---|---|
| 6,287,021 B1 * | 9/2001 | Katoh et al. | ................. | 396/348 |
| 6,882,726 B2 * | 4/2005 | Kim | ...................... | 379/433.13 |
| 7,046,287 B2 * | 5/2006 | Nishino et al. | ......... | 348/333.06 |
| 7,193,653 B2 * | 3/2007 | Lee | ............................ | 348/373 |
| 2004/0095500 A1 * | 5/2004 | Sato et al. | .................... | 348/340 |
| 2006/0166712 A1 * | 7/2006 | Wu | ......................... | 455/575.1 |

FOREIGN PATENT DOCUMENTS

| | | |
|---|---|---|
| CN | 1404284 A | 3/2003 |
| JP | 10-075287 A | 3/1998 |

* cited by examiner

*Primary Examiner*—Lin Ye
*Assistant Examiner*—Chriss S Yoder, III
(74) *Attorney, Agent, or Firm*—Drinker Biddle & Reath LLP

(57) ABSTRACT

A pop-up camera and a mobile phone including the same, the camera being insertable in and protrudale from the main body of the mobile phone when a user uses the camera, and a flexible printed circuit board (FPCB) that provides a stable electrical connection between a camera part and a main board of the mobile phone stably when the camera is protruded from the main body of the mobile phone or rotates.

19 Claims, 9 Drawing Sheets

POP-UP CAMERA MODULE AND MOBILE PHONE INCLUDING THE SAME

BACKGROUND OF THE INVENTION

This application claims the priority of Korean Patent Application No. 2004-59511, filed on Jul. 29, 2004, in the Korean Intellectual Property Office, the disclosure of which is incorporated herein in its entirety by reference.

1. Field of the Invention

The present invention relates to a mobile phone including a pop-up camera module, and more particularly, to a mobile phone having a pop-up camera module that protrudes from the main body of the mobile phone so as to photograph a subject.

2. Description of the Related Art

As data transmission rates increase, the sizes of LCD's decrease, and electronic circuits become increasingly integrated, mobile phones increasingly can transmit pictures as well as voice.

Conventional folder-type mobile phones are typically composed of a main body housing and a folder, with a hinge unit formed between the main body housing and the folder. The hinge unit typically comprises a main body connector and a folder connector which are rotatably interconnected by a hinge-connecting structure. Moreover, some conventional folder-type mobile phones include a camera module which is capable of rotating by 180° for focusing a subject for photographing, and which is mounted to the main body connector or to the folder connector of the hinge unit.

With typical mobile phones, a portion of the camera module must protrude a predetermined amount, in order for a user of the mobile phone to adjust the rotation angle of the camera module to an angle desired by a user. Such a protrusion of a camera module detracts from the goal of producing flat- and small-sized mobile phones. Moreover, protrusion of a camera module from a mobile phone can make the camera module more susceptible to damage from an impact, for example, if the mobile phone is dropped by a careless user. Protrusion of a camera module from a mobile phone also requires a complicated shape and design and detracts from the appearance of the phone, which has the potential to lead to consumer dissatisfaction with the phone. Moreover, the shape of the mobile phone having a protrusion thereon.

SUMMARY OF THE INVENTION

The present invention provides a pop-up camera and a mobile phone including the same, the camera being included in and conveniently protruding from the main body of the mobile phone.

The present invention also provides a pop-up camera and a mobile phone including the same, wherein when the camera is protruded from the main body of the mobile phone is rotated, a FPCB stably electrically connects the camera and a main board of mobile phone.

According to an aspect of the present invention, there is provided a pop-up camera module, comprising: a camera part embedding a camera comprising an image pick-up device and a lens; a side cover arranged spaced from and opposite the camera part; a length changing unit placed to connect the side cover and the camera part, and to change its length along its longitudinal axis; and a FPCB including an axial displacement part having a regular length and fully winding the length changing unit in a helical shape, thereby strain dose not occur when the length of the length changing unit becomes the largest and electrically connecting the image pick-up device and an external circuit board.

A base cover arranged between the camera part and the side cover comprises one end storing the camera part to protrude and the other end combined to the side cover, the length changing unit passes through the base cover along a connecting axis of the camera part, and the axial displacement part fully winds the length changing unit in a helical shape in a rectilinear guide space of the base cover and the length changing unit.

The length changing unit may comprise a fixing rod having one side fixed to the side cover and a displacing rod having one side fixed to the camera part and the other side combined to the fixing rod to change the length stored inside the fixing rod.

The length changing unit may be a toggle type pressing apparatus, and when the camera part is pressed toward a longitudinal axis once, the camera part is protruded from or stored in the base cover.

According to another aspect of the present invention, there is provided a mobile phone, comprising a main body of mobile phone comprising a case part having embedding a main board, and a camera case part having a hollow cylindrical shape; a camera part embedding an image pick-up device and a lens and being stored to protrude on one side of the camera case part; a side cover arranged spaced on other side of the camera case part; a length changing unit connecting the side cover and the camera part in the camera case part and being formed to change its length along the longitudinal axis; and a FPCB including an axial displacement part having a regular length and fully winding the length changing unit in a helical shape, thereby strain dose not occur when the length of the length changing unit becomes the largest and electrically connecting the image pick-up device and the main board.

The mobile phone may comprise a base cover having a hollow cylindrical shape combined inside of the camera case part, the camera part being stored to protrude on one end of the base cover, the side cover being combined to the other end of the base cover, and the FPCB is formed to pass through the inside of the base cover.

The main body of the mobile phone may further comprise a folder part hinge-combined with the case part of the main body by a hinge part, and the camera case part may be formed by the hinge part.

According to the pop-up camera module and the mobile phone including the same having the structure and functions described above, the mobile phone can be made flat, can be stored in a variety of square-type mobile phone cases, and can have a good appearance, and simultaneously, the FPCB electrically can connect between the camera and the main board of mobile phone stably without being twisted.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings.

Figure 1:
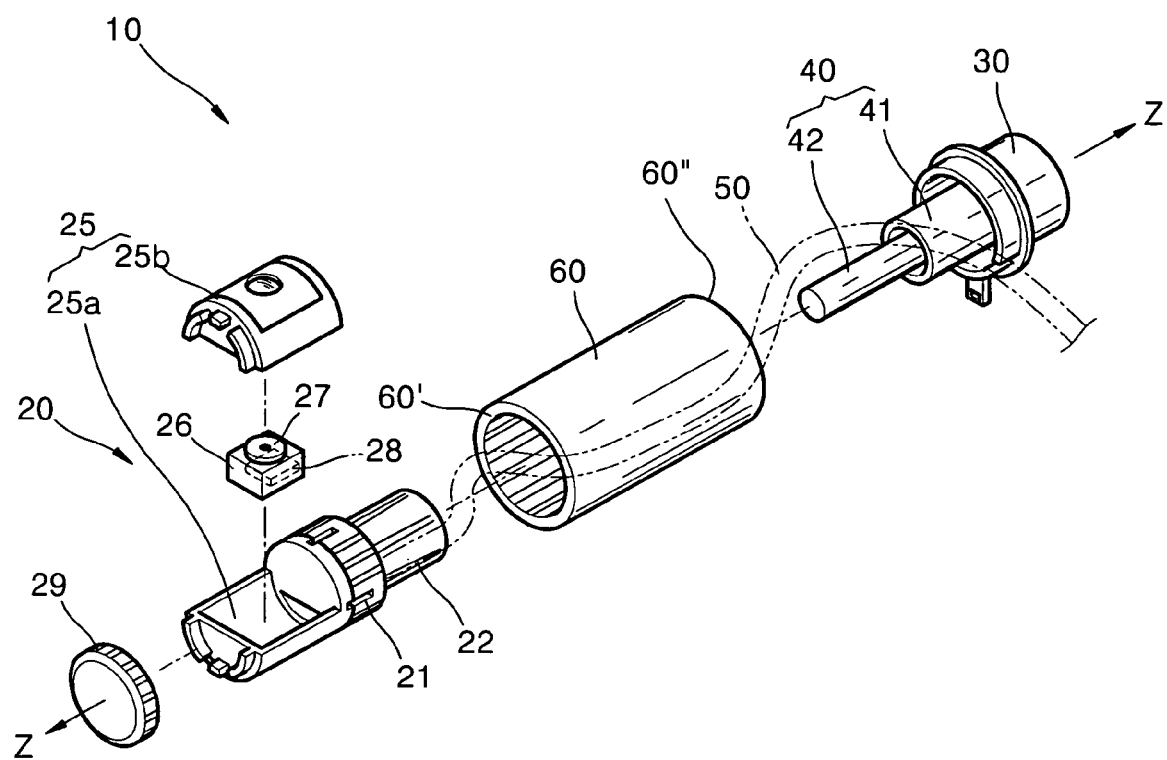
FIG. 1 is a perspective view illustrating a pop-up camera module according to an embodiment of the present invention.
Figure 2:
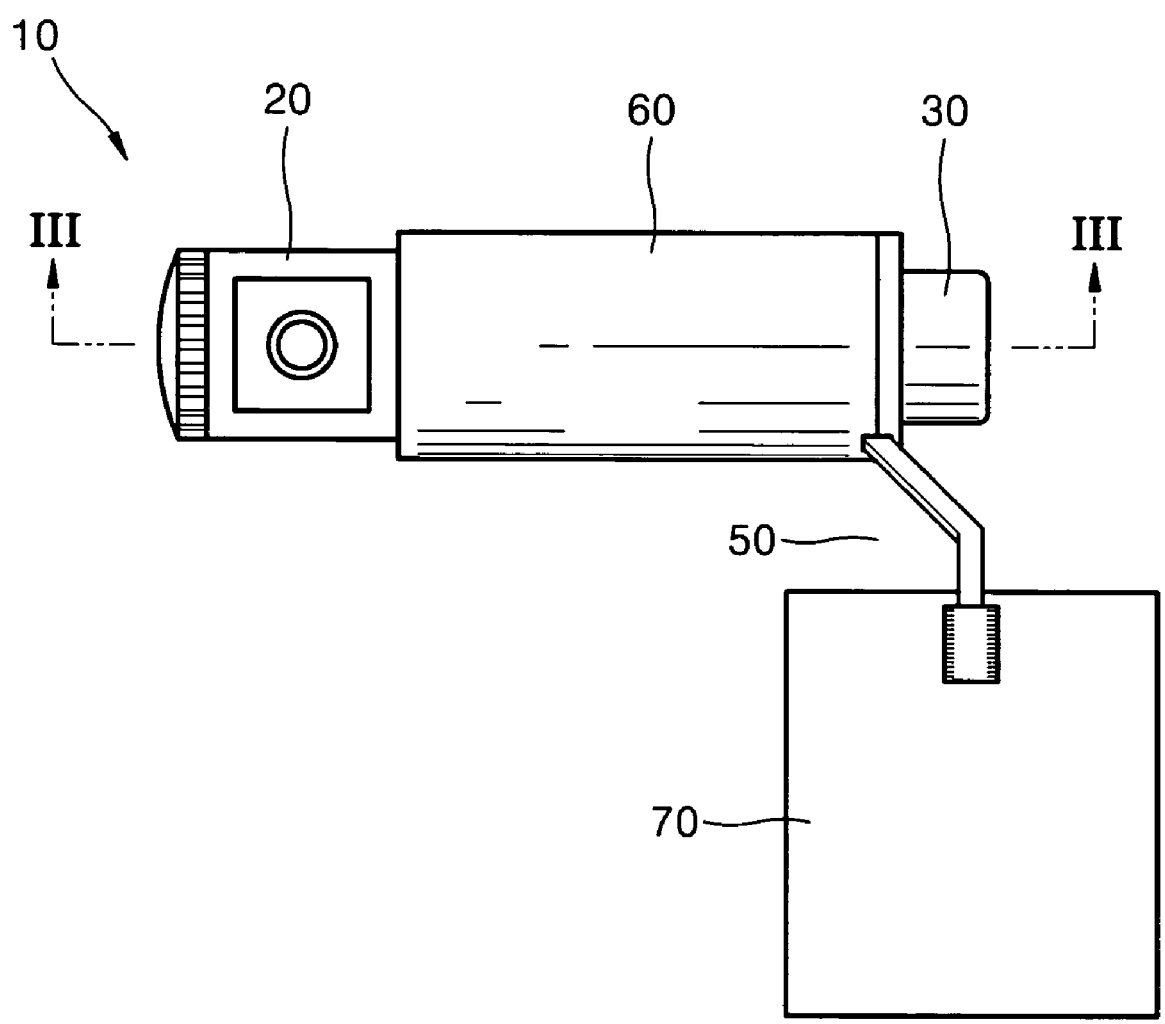
FIG. 2 is a perspective view illustrating devices of FIG. 1.
Figure 3:
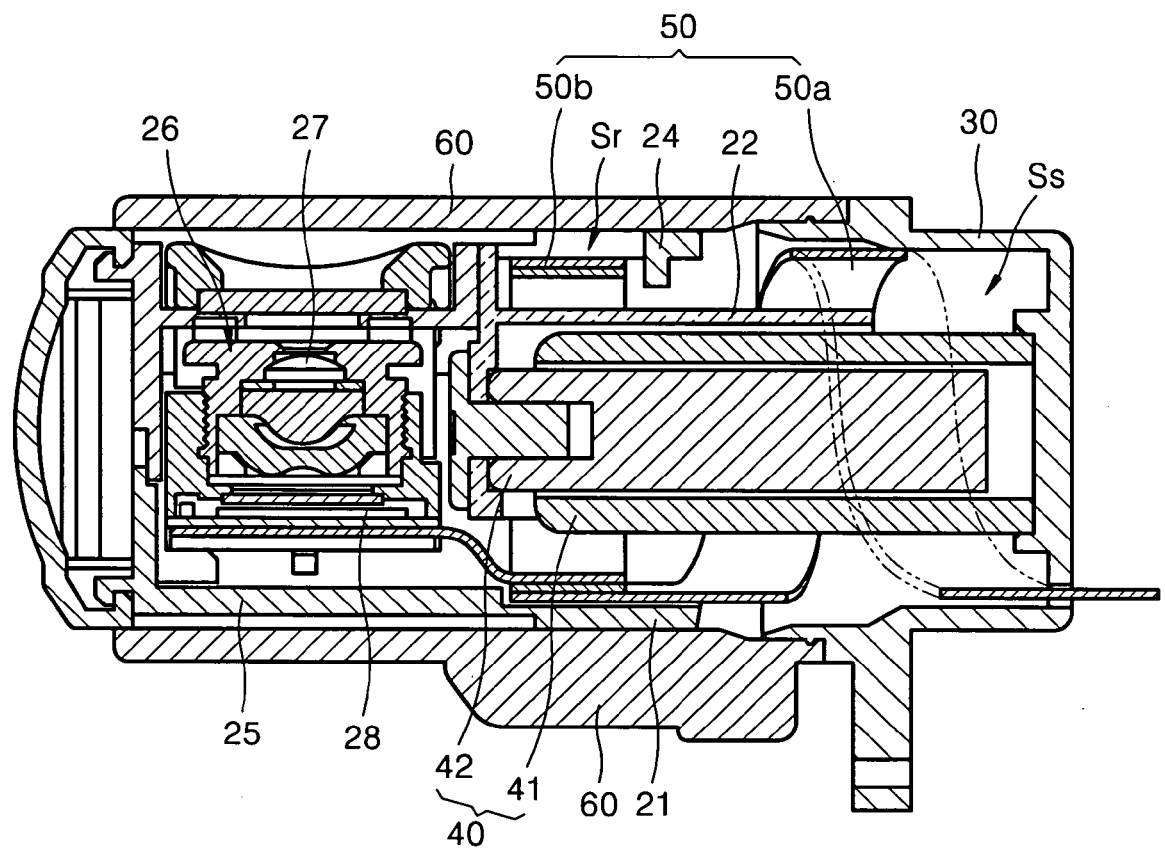
FIG. 3 is a sectional view taken along line III-III of FIG. 2.

FIG. 1 is a perspective view illustrating a camera module 10 according to an embodiment of the present invention, FIG. 2 is a separate perspective view illustrating devices of the camera module 10, and FIG. 3 is a sectional view taken along line III-III of FIG. 2. Referring to FIGS. 1 to 3, the pop-up camera module 10 comprises a camera part 20, a side cover 30, a length changing unit 40, and a flexible printed circuit board (FPCB) 50.

A camera 26 is embedded in the camera part 20. The camera part 20 comprises a camera storage part 25, a first guide cylinder part 21, and a second guide cylinder part 22. The camera storage part 25 comprises a lower camera storage part 25a that usually stores the camera, and an upper camera storage part 25b that covers the camera, and further a storage fixing part 29 between the lower and upper camera storage parts 25a and 25b. The camera 26 comprises an image pick-up device 28, such as a CCD or a CMOS, and a lens 27 to photograph a picture. The camera part 20 is preferably situated at a distance from and in an opposing spatial arrangement with the side cover 30. In this regard, the side cover 30 and the camera part 20 are preferably connected by the length changing unit 40 that is changeable in length along a Z-axis direction.

In an embodiment of the present invention, a base cover 60 is placed between the camera part 20 and the side cover 30. The base cover 60 is a hollow cylinder in which the camera part 20 is stored to protrude toward one end 60' of the base cover, and the side cover 30 is connected to the other end 60" of the base cover. When the length of the length changing unit 40 is short, the camera part 20 is stored in the base cover 60. When the length of the length changing unit 40 becomes longer, the camera part 20 is protruded from the end 60' of the base cover.

The length changing unit 40 preferably inserts into and passes through the inside of the base cover 60. A rectilinear guide space Ss exists between the length changing unit 40 and the base cover 60. An axial displacement part 50a is mounted in the rectilinear guide space Ss to prevent the base cover 60 from being contacted from the outside due to a longer width of the axial displacement part 50a, thereby protecting the FPCB 50.

The camera part 20 is connected to an external circuit board 70 via the FPCB 50. The FPCB 50, a side of which is connected to the image pick-up device 28 of the camera part and the other side of which is combined to the exterior circuit board electrically, is connected between the exterior circuit board 70 and the image pick-up device 28.

Figure 4A:
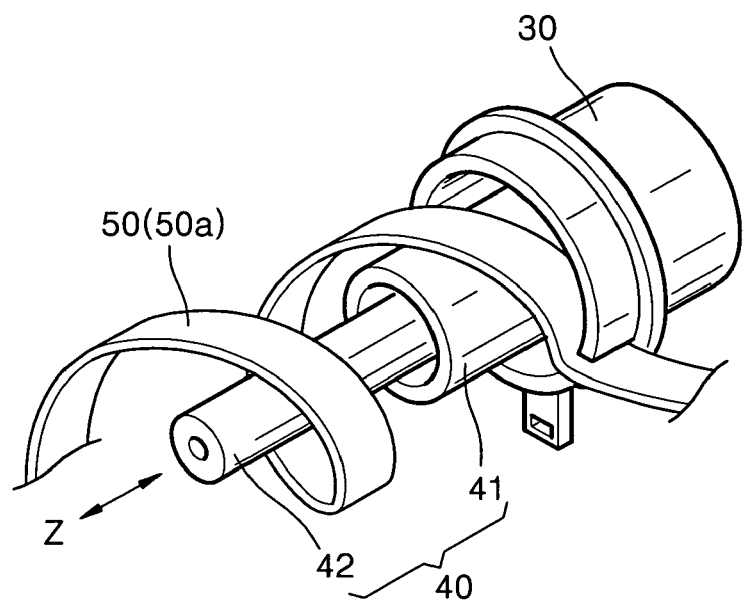
FIGS. 4A and 4B are perspective views illustrating a FPCB and a length changing unit corresponding to a rectilinear guide space of FIG. 1.
Figure 4B:
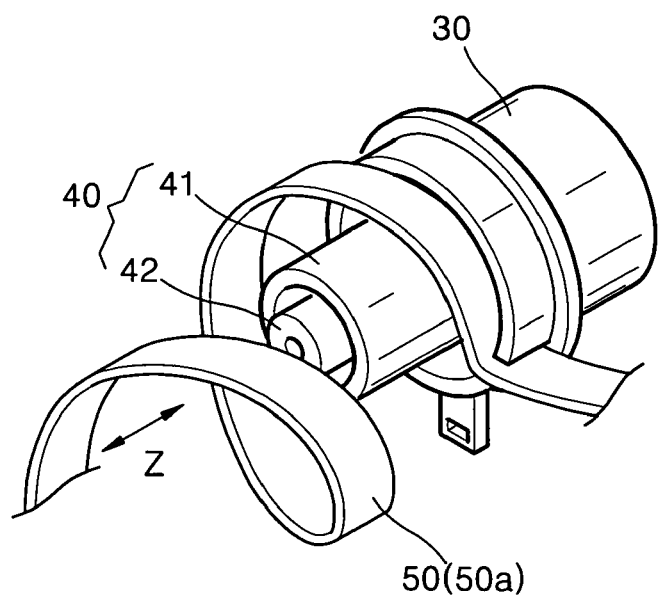

The FPCB 50 comprises the axial displacement part 50a. Referring to FIGS. 3, 4A, 4B, the axial displacement part 50a is formed to have a regular length and to change the length of the length changing unit 40 by a helicoidal motion. When the length changing unit 40 becomes longer, the axial displacement part 50a is formed to have a suitable length such that strain does not occur at either the camera part 20 or the exterior circuit board 70.

It is preferable for the FPCB 50 to maintain stable electrical connection between the camera part 20 and the exterior circuit board. In this regard, it is preferable for the FPCB 50 to not be forced by the camera part 20 or the exterior circuit board 70.

The length changing unit 40 preferably comprises a fixing rod 41 and a displacing rod 42. The fixing rod 41 preferably extends along the Z-axis and has one side fixed to the side cover 30. The displacing rod 42 preferably has one side fixed to the camera module and the other side inserted inside the fixing rod 41.

The length of the displacing rod 42 inside of the fixing rod 41 is changeable. When the portion of the displacing rod 42 inside of the fixing rod 41 is short, the length of the length changing unit 40 as a whole, is longer and the camera part 20 protrudes from the base cover 60. When the portion of the displacing rod 42 inside of the fixing rod 41 is long on the other hand, the entire length of the length changing unit 40 as a whole is shorter and the camera part 20 is stored in the base cover 60.

The length changing unit 40 can be a toggle-type pressing apparatus. In particular, pressing the camera part 20 toward the Z-axis while it is mastered position inside the base cover. Moreover, pressing the camera 20 once toward the Z-axis while it is in a protruded position outside of one side 60 of the base cover, can cause the camera part to be stored in the base cover.

As shown in FIG. 4A, when the displacing rod 42 is pressed toward the axis Z, the displacing rod 42 is protruded outside of the fixing rod 41. As shown in FIG. 4B, when the protruded displacing rod 42 is pressed toward the axis Z, the displacing rod 42 inserted in the fixing rod 41 becomes longer.

In the embodiment of the present invention, a toggle-type pressing apparatus is created where in a spring is inserted between the side cover 30 and the displacing rod 42 inside of the fixing rod 41, and the fixing rod 41 comprises fixation protrusions that are spatially separated on the side of the fixing rod 41. Displacement protrusions that can be hooked to the fixation protrusions in a column direction are preferably arranged to be spaced from each other on other side end of the displacing rod 42. In this regard, when the displacing rod 42 is inserted in the fixing rod 41, the displacement protrusions are passed through between the fixation protrusions and are hooked to the displacement protrusions, such that the displacing rod 42 is stored in the fixing rod 41. Next, when the In this state, when the displacing rod 42 is pressed again toward the Z-axis, the displacement protrusions can rotate to pass between the fixation protrusions, such that the displacing rod can protrudes from the fixing rod 41.

Accordingly, it is not necessary to use the hand in order to protrude the camera part 20 from the base cover 60, so that the camera part 20 can be stored without being protruded from the base cover 60.

Figure 5A:
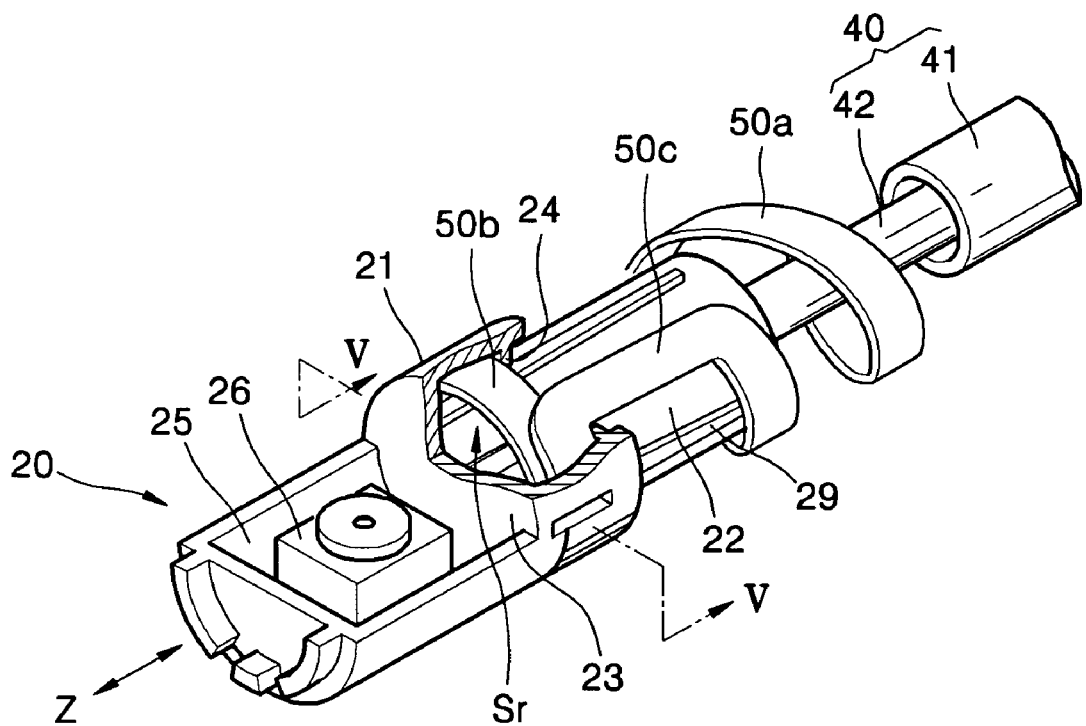
FIG. 5A is a perspective view illustrating a camera part and a FPCB corresponding to a rotation guide space of FIG. 1.

As shown in FIG. 5A, the camera part 20 can comprise a camera 26, a camera storage part 25, a first guide cylinder part 21, and a second guide cylinder part 22. The first guide cylinder part 21, in this regard, can be a hollow cylinder that extends along the Z-axis from the camera storage part 25. The second guide cylinder part 22 can be formed along the Z axis in line with the first guide cylinder part 21 and can have a smaller radius than that of the first guide cylinder part 21.

The camera storage part 25 can further comprise an inner base part 23 that is formed on the side of the camera storage part 25 that is adjacent to the side cover 30. Moreover, the inner base part 23 can be fixed to one side of the displacing rod 42. Additionally, when the inner base part 23 is formed in the camera part 20, the second guide cylinder part 22 can be formed such that it extends toward the side cover 30 from the inner base part 23. In this regard, a regular space or rotation guide space Sr is formed between the first guide cylinder part 21 and the second guide cylinder part 22.

The FPCB 50 can further comprise a rotation displacement part 50b that is disposed in a plurality of layers and wound in the rotation guide space Sr. Preferably, in this regard, a sufficient distance exists between each layer of the rotation displacement part 50b and the second guide cylinder part 22, such that neither side of the FPCB 50 is not strained when the camera part 20 is rotated.

The rotation displacement part 50b and the axial displacement part 50a can be adjacent to each other, wherein, for example, the rotation displacement part 50bis formed along the Z axis and the axial displacement part 50a is tilted toward the Z axis. The rotation displacement part 50b and the axial displacement part 50apreferably do not influence each other, however. Preferably, in this regard, the FPCB 50 comprises a displacement connecting part 50c which is placed toward the Z axis and which connects the rotation displacement part 50b and the axial displacement part 50a to lessen or reduce strain on the FPCB 50, caused, for example, when the camera part 20 is rotated wherein the length of the axial displacement part 50a changes, and when the camera part 20 is protruded or stored wherein the length of the rotation displacement part 50b can change.

Figure 5B:
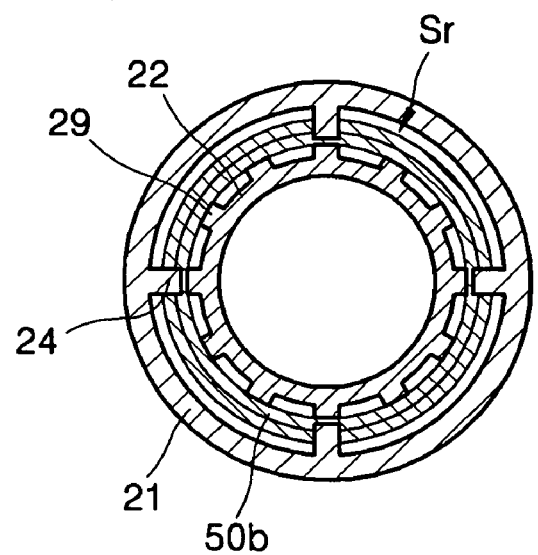
FIG. 5B is a sectional view taken along line V-V of FIG. 5A.

As shown in FIG. 5B, the rotation displacement part 50b is interposed between the first guide cylinder part 21 and the second guide cylinder 22. The second guide cylinder part 22 can comprise a plurality of protrusions 29 on the outer surface of the second guide cylinder part 22 which protrude along the Z axis, and which are situated at regular intervals. The rotation displacement part 50b can be formed on the protrusions 29 and placed in a recess between the protrusions 29, such that the rotation displacement part 50b has sufficient space to rotate and loosely wind the outer surface of the second guide cylinder part 22.

A plurality of protrusion guide parts 24 for guiding the rotation displacement part 50b in the rotation guide space Sr can be formed on the inner surface of the first guide cylinder part 21, at the end of the inner surface which is adjacent to the side cover 30 and which forms a boundary line of the rotation guide space Sr.

Figure 6:
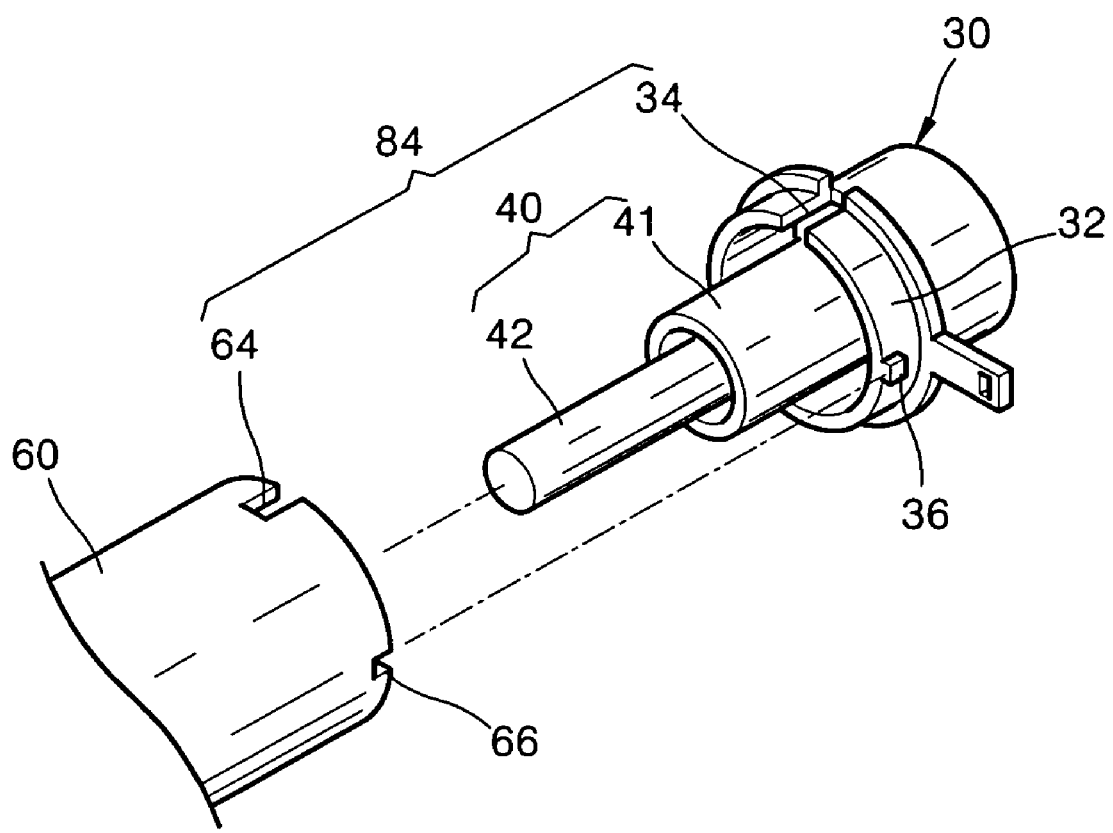
FIG. 6 is an enlarged separate perspective view illustrating a base cover and a side cover of FIG. 1.

As shown in FIG. 6, the side cover 30 can be connected to the base cover 60 at an opposite end of the base cover from where the camera part is inserted. The side cover 30 can comprise a side 32 that is insertable into the base cover 60, and a first slit 34 through which the FPCB 50 passes. The base cover 60 can comprise a second slit 64 which is situated at an adjacent location to the first slit 34 of the side cover 30. In this manner, a through-hole 84 can be formed through a combination of the first slit 34 and the second slit 64, when the side cover 30 is connected to the base cover 60.

The axial displacement part 50a in the FPCB 50 can wind around the length changing unit 40 in a spiral or helical direction and can be inserted into the first slit 34. Moreover, if the base cover 60 is connected to the side cover 30, then the FPCB 50 can pass stably through the through-hole 84 which is formed by a combination of the first slit 34 and the second slit 64. The side cover 30 comprises a first combination part 36, and the base cover 60 comprises a second combination part 66. Thus, the side cover 30 is combined to the base cover 60 via the first combination part 36 and the second combination part 66.

Figure 7:
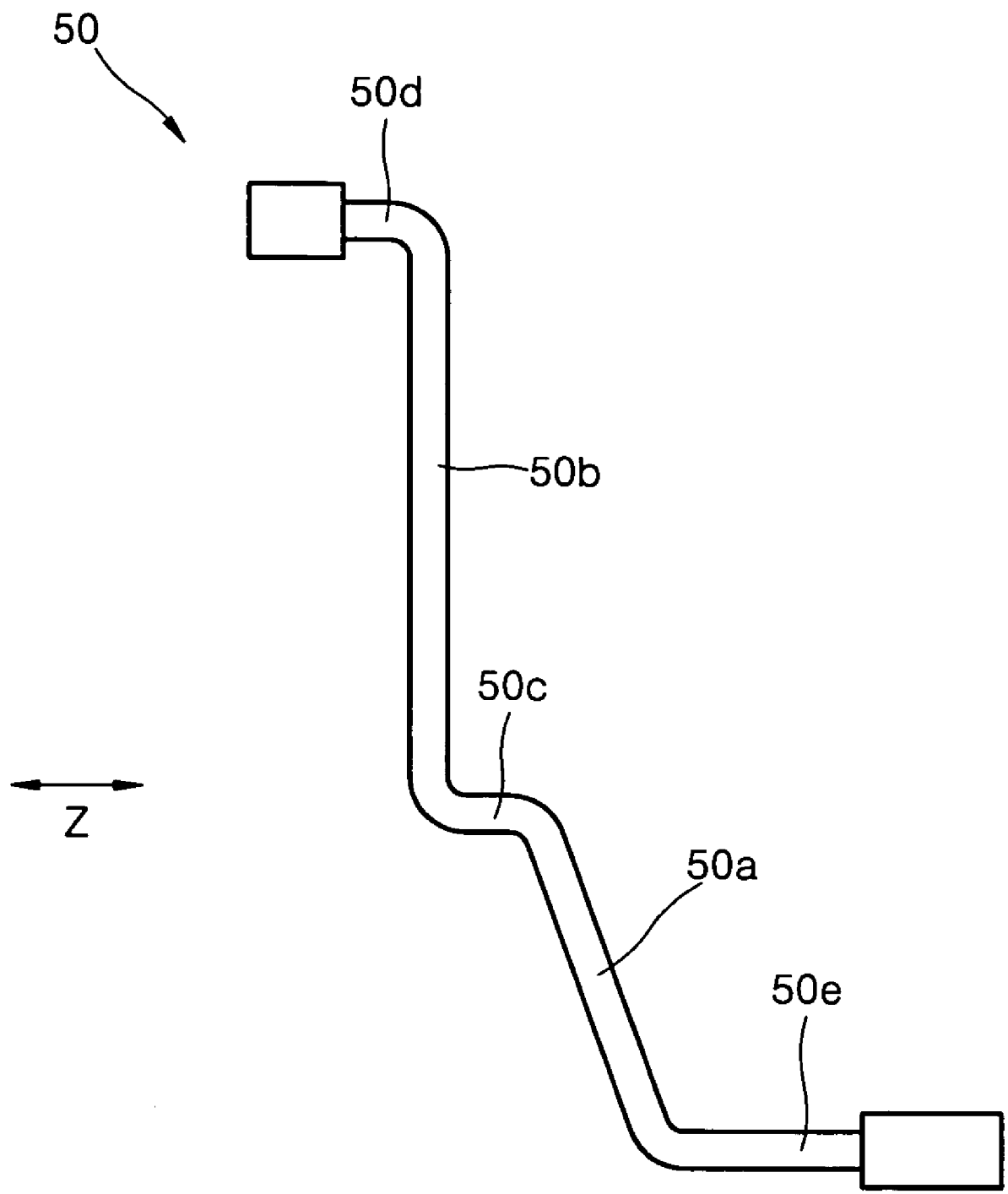
FIG. 7 is a sectional view illustrating a FPCB of FIG. 1.

As shown in FIG. 7, the FPCB 50 can comprise a rotation displacement part 50b which is disposed in a circumferential direction along the Z axis within the rotation guide space Sr, an axial displacement part 50a which is arranged inside the rectilinear guide spaces and which is in a tilted position toward the Z axis, a camera combiner 50d which is connected to the camera part, an exterior circuit board combiner 50e which is connected to an exterior circuit board, and a displacement connecting part 50c which connects the rotation displacement part and the axial displacement part.

Figure 8:
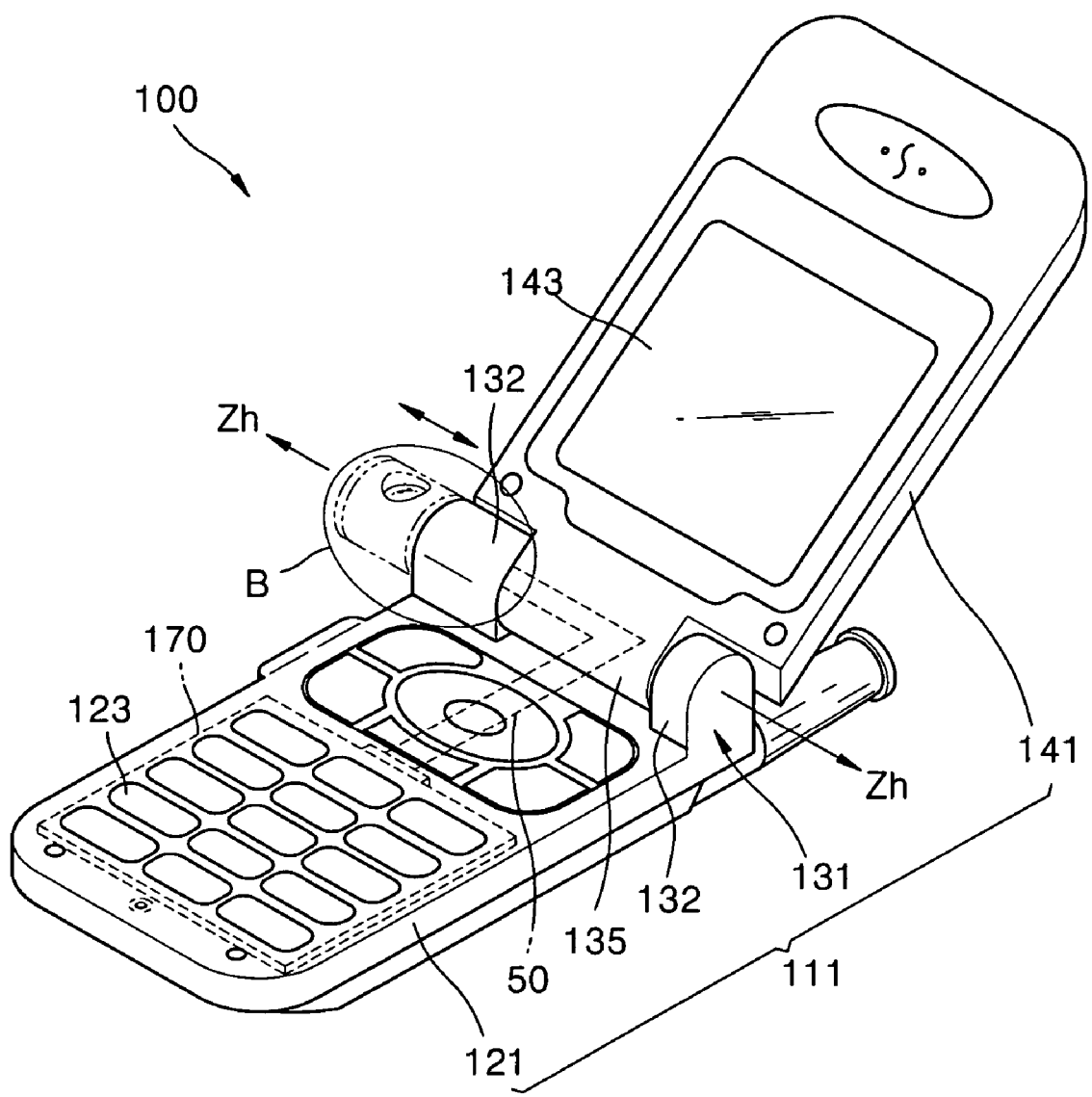
FIG. 8 is a perspective view illustrating a mobile phone including a pop-up camera module according to another embodiment of the present invention.
Figure 9:
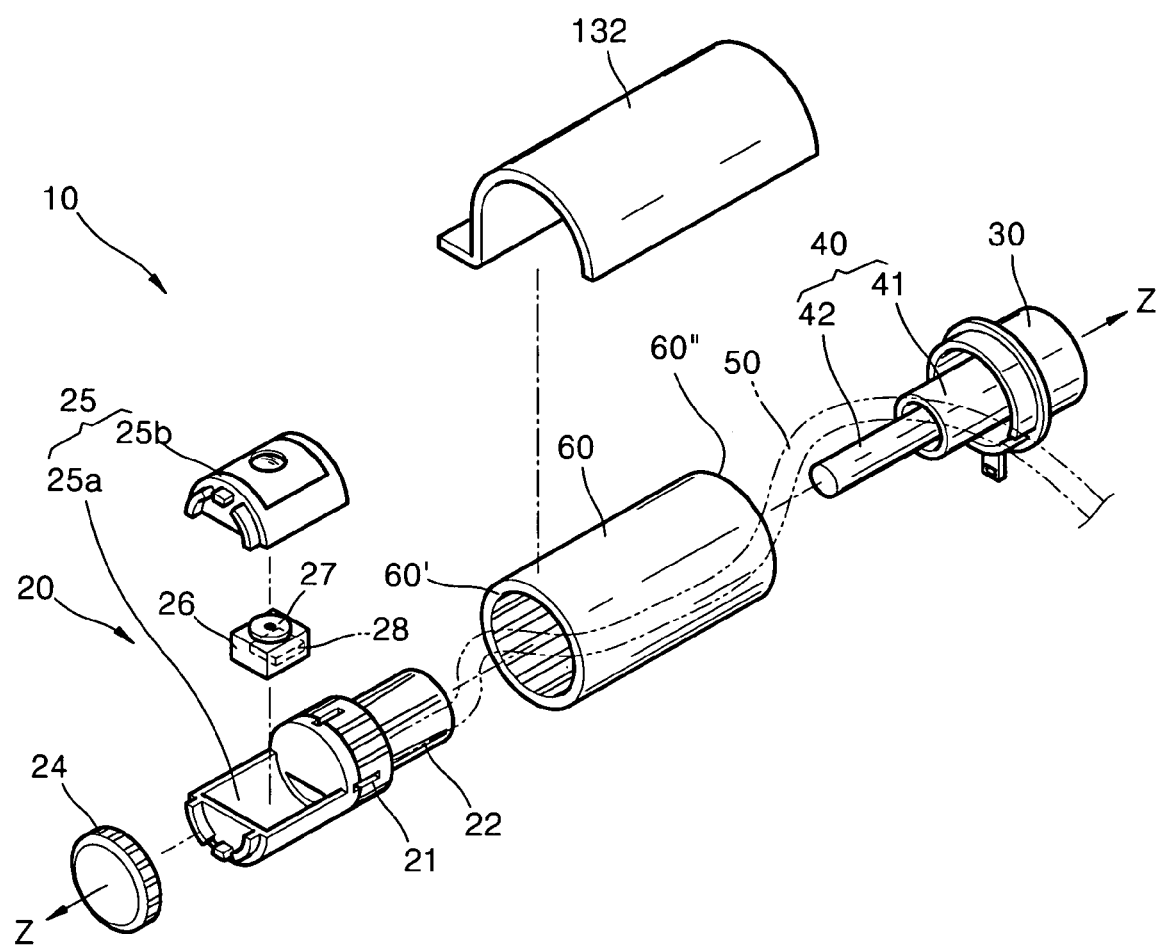
FIG. 9 is an enlarged separate perspective view illustrating part B of FIG. 8.

Another embodiment of the present invention includes a mobile phone 100 comprising the pop-up camera module 10 having the same structure as described above, as illustrated in FIGS. 8 and 9. FIG. 8, in this regard, illustrates a mobile phone 100 including the pop-up camera module 10 which comprises the camera part 20, a main body of mobile phone 111, the side cover 20, the length changing unit 40, and the FPCB 50. FIG. 9 illustrates an enlarged separated perspective view of part B of FIG. 8.

The main body 111 of the mobile phone can comprise a main body case part 121 that embeds a main board 170 and which has a plurality of key buttons 123 on its front. The plurality of key buttons 123 can be composed of character keys, number keys, a delete key, an end key, and special function keys. The main body 111 of the mobile phone can comprise a camera case part 132 that stores a camera part 20 on one end, such that the camera part 20 is insertable into and protrudable from camera case part 132. The main body can also comprise a folder part 141 having a display window 143 such as an LCD, OLED, etc. to show images such as telephone numbers, characters, motion pictures, and/or the like.

The folder part 141 and the main body case part 121 can be hinge-combined around a hinge axis Zh by a hinge part 131, such that the folder part 41 can be opened and closed with respect to the main body case part 121 around the hinge axis Zh. The camera case parts 132 can be situated on the opposite side of the main body case part 121 from the hinge part 131. Moreover, a guide arm 135 can be inserted onto the folder part 141 between the camera case parts 132, and the camera part 20 can be placed in one of the camera case parts 132. A side cover 30 can be connected to an end of the camera case part 132 that is opposite from the end at which the camera case is connected.

As shown in FIG. 9, the base cover 60 can have a hollow cylindrical shape and can be connected to the inner side of the camera case part 132. Moreover, the camera part 20 can be insertable into and projectable from the 60' end of the base cover 60, and the side cover 30 can be connected to the 60" end of the base cover 60. Moreover, the FPCB 50 can pass through the inner side of the base cover 60.

The side cover 30 and the camera part 20 can be connected by the length changing unit 40, which can pass through the camera case part 132, which is changeable in length along the Z axis direction (or, in case of a folder type camera, along the hinge Zh axis). Therefore, the camera part 20 can be insertable into and protrudable from the camera case part 132. The length changing unit 40, in this regard, can be a toggle-type pressing apparatus comprising the fixing rod 41 and the displacing rod 42, as shown in FIGS. 4A and 4B.

The camera part 20, as shown in FIG. 5, can comprise a camera storage part 25 that stores the camera 26, a first guide cylinder part 21 which has a hollow cylindrical shape and which extends from the camera storage part 25 around the Z axis toward the side cover 30, and a second guide cylinder part 22 which has a radius which is smaller than the radius of the first guide cylinder part 21 and bigger than the radius of the length changing unit 40. In this manner, the rotation guide space Sr can be formed between the first guide cylinder part 21 and the second guide cylinder part 22.

The FPCB 50 can comprise an axial displacement part 50a, which, as discussed above, can be disposed in a plurality of layers and wound in a perpendicular direction within the rotation guide space Sr to the second guide cylinder part 22, such that strain dose not occur at the image pick-up device or at the main board when the length of the length changing unit is changed.

The first guide cylinder part 21 can comprise a plurality of protrusion guide parts 24 which guide the rotation displacement part 50b into the rotation guide space Sr and prevent them from being drawn outside, and which are formed at the end of the inner surface within the rotation guide space Sr that is adjacent to the side cover 30 of the rotation guide space Sr in the inner surface of the first guide cylinder part 21.

As shown in FIG. 6, and as discussed above, the side cover 30 can be connected to the base cover 60 at an opposite end of the base cover from where the camera part is inserted. The side cover 30 can comprise a side 32 that is insertable into the base cover 60, and a first slit 34 through which the FPCB 50 passes. The base cover 60 can comprise a second slit 64 which is situated at an adjacent location to the first slit 34 of the side cover 30. In this manner, a through-hole 84 can be formed through a combination of the first slit 34 and the second slit 64, when the side cover 30 is connected to the base cover 60.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A pop-up camera module comprising:
    a camera part that embeds a camera comprising an image pick-up device and a lens;
    a side cover which is situated at an opposite side of a camera case part from the camera part;
    a length changing unit which connects the side cover and the camera part, and which is changeable in length along its longitudinal axis, the length changing unit comprising a fixing rod having one side connected to the side cover, and a displacing rod having one side connected to the camera part and another side connected to the fixing rod;
    a base cover which is situated between the camera part and the side cover, the base cover comprising one end into which the camera part protrudes and is stored, and another end which is connected to the side cover, the length changing unit passing through the base cover along a connecting axis of the camera part, and a rectilinear guide space being defined between the base cover and the length changing unit; and
    a flexible printed circuit board (FPCB) comprising an axial displacement part that electrically connects the image pick-up device and an external circuit board, the axial displacement part winding around the length changing unit in a helical shape within the rectilinear guide space, such that strain does not occur at the camera part or at the external circuit board when the length of the length changing unit is maximized,
    wherein the camera part comprises a camera storage part that stores a camera, a first guide cylinder part having a hollow cylindrical shape that extends from the camera storage part around a protruding axis toward the side cover, and a second guide cylinder part having a radius that is smaller than the radius of the first guide cylinder part and bigger than the radius of the length changing unit, and
    the FPCB comprises a rotation displacement part which is situated in a rotation guide space located between the first guide cylinder part and the second guide cylinder part, and which is disposed in plural layers along a circumferential direction to the second guide cylinder part, such that strain does not occur at the camera part or at the external circuit board when the length of the length changing unit is changed.

2. The pop-up camera module of claim 1, wherein the side cover comprises a side which comprises a first slit and which is insertable into the base cover, and wherein the base cover comprises a second slit which is adjacent to the first slit, such that the first slit and the second slit collectively form a through-hole into which the FPCB inserts and through which the FPCB passes.

3. The pop-up camera module of claim 1, wherein the first guide cylinder part comprises a plurality of protrusion guide parts for guiding the rotation displacement part in the rotation guide space, and wherein the plurality of protrusion guide parts are formed on the inner surface of the first guide cylinder at the end of the inner surface which is adjacent to the side cover.

4. The pop-up camera module of claim 1, wherein the second guide cylinder part comprises a plurality of protrusions on the outer surface of the second guide cylinder part which protrude at regular intervals along the longitudinal axis of the length changing unit and which situate at least a portion of the rotation displacement part.

5. The pop-up camera module of claim 1, wherein the FPCB comprises a displacement connecting part which is situated along the longitudinal axis of the length changing unit, and which connects the rotation displacement part and the axial displacement part.

6. The pop-up camera module of claim 1, wherein the length changing unit is a toggle-type pressing apparatus, such that when the camera part is pressed once toward a longitudinal axis, the camera part protrudes from or stores in the base cover.

7. A mobile phone comprising:
    a main body comprising a case part that embeds a main board, and a camera case part having a hollow cylindrical shape;
    a camera part which embeds an image pick-up device and a lens, and which is protrudable from a storage site on one side of the camera case part;
    a side cover which is situated at an opposite side of the camera case part from the camera part;
    a length changing unit which connects the side cover and the camera part, and which is changeable in length along its longitudinal axis;
    a flexible printed circuit board (FPCB) comprising an axial displacement part that electrically connects the image pick-up device and the main board, wherein the FPCB winds around the length changing unit in a helical shape, such that strain does not occur at the image pick-up device or at the main board when the length of the length changing unit is changed; and
    a base cover with a hollow cylindrical shape which is situated in the camera case part and between the camera part and the side cover, the base cover comprising one end into which the camera part protrudes and is stored, and another end which is connected to the side cover, the FPCB passing through the base cover, wherein the camera part comprises a camera storage part that stores a camera, a first guide cylinder part having a hollow cylindrical shape that extends from the camera storage part to the side cover, and a second guide cylinder part having a radius that is smaller than the radius of the first guide cylinder part and bigger than the radius of the length changing unit, and the FPCB comprises a rotation displacement part which is situated in a rotation guide space located between the first guide cylinder part and the second guide cylinder part, and which is disposed in plural layers in a direction perpendicular to the second guide cylinder part, such that strain does not occur at the image pick-up device or at the main board when the length of the length changing unit is changed.

8. The mobile phone of claim 7, wherein the length changing unit comprises a fixing rod having one side connected to the side cover and extending along the longitudinal axis, and a displacing rod having one side connected to the camera part and the other side connected to the fixing rod and extending along the longitudinal axis, wherein the camera part is insertable into and protrudable from the fixing rod, and wherein the length changing unit is a toggle-type pressing apparatus such that when the camera part is pressed toward the longitudinal axis once, the camera part protrudes from or stores in the base cover.

9. The mobile phone of claim 7, wherein the first guide cylinder part comprises a plurality of protrusions for guiding the rotation displacement part that is situated in the rotation guide space, wherein the plurality of protrusions are formed on the inner surface of the first guide cylinder part at the end of the inner surface which is adjacent to the side cover.

10. The mobile phone of claim 7, wherein the side cover comprises a side which comprises a first slit and which is insertable into the base cover, and wherein the base cover comprises a second slit which is adjacent to the first slit, such that the first slit and the second slit collectively form a through-hole into which the FPCB inserts and through which the FPCB passes.

11. The mobile phone of claim 7, wherein the main body of the mobile phone comprises a folder part which is hinge-connected by a hinge part with a case part which forms the camera case part.

12. The mobile phone of claim 7, wherein the second guide cylinder part comprises a plurality of protrusions on the outer surface of the second guide cylinder part which protrude at regular intervals along the longitudinal axis of the length changing unit and which situate at least a portion of the rotation displacement part.

13. A pop-up camera module comprising:
a camera part that embeds a camera comprising an image pick-up device and a lens;
a side cover which is situated at an opposite side of a camera case part from the camera part;
a length changing unit which connects the side cover and the camera part, and which is changeable in length along its longitudinal axis;
a base cover which is situated between the camera part and the side cover, the base cover comprising one end into which the camera part protrudes and is stored, and another end which is connected to the side cover, the length changing unit passing through the base cover along a connecting axis of the camera part, and a rectilinear guide space being defined between the base cover and the length changing unit; and
a flexible printed circuit board (FPCB) comprising an axial displacement part that electrically connects the image pick-up device and an external circuit board, the axial displacement part winding around the length changing unit in a helical shape within the rectilinear guide space, such that strain does not occur at the camera part or at the external circuit board when the length of the length changing unit is maximized, wherein the camera part comprises a camera storage part that stores a camera, a first guide cylinder part having a hollow cylindrical shape that extends from the camera storage part around a protruding axis toward the side cover, and a second guide cylinder part having a radius that is smaller than the radius of the first guide cylinder part and bigger than the radius of the length changing unit, and the FPCB comprises a rotation displacement part which is situated in a rotation guide space located between the first guide cylinder part and the second guide cylinder part, and which is disposed in plural layers along a circumferential direction to the second guide cylinder part, such that strain does not occur at the camera part or at the external circuit board when the length of the length changing unit is changed.

14. The pop-up camera module of claim 13, wherein the first guide cylinder part comprises a plurality of protrusion guide parts for guiding the rotation displacement part in the rotation guide space, and wherein the plurality of protrusion guide parts are formed on the inner surface of the first guide cylinder at the end of the inner surface which is adjacent to the side cover.

15. The pop-up camera module of claim 13, wherein the second guide cylinder part comprises a plurality of protrusions on the outer surface of the second guide cylinder part which protrude at regular intervals along the longitudinal axis of the length changing unit and which situate at least a portion of the rotation displacement part.

16. The pop-up camera module of claim 13, wherein the FPCB comprises a displacement connecting part which is situated along the longitudinal axis of the length changing unit, and which connects the rotation displacement part and the axial displacement part.

17. The pop-up camera module of claim 13 wherein the length changing unit is a toggle-type pressing apparatus, such that when the camera part is pressed once toward a longitudinal axis, the camera part protrudes from or stores in the base cover.

18. The pop-up camera module of claim 13 wherein the length changing unit comprises a fixing rod having one side connected to the side cover, and a displacing rod having one side connected to the camera part and another side connected to the fixing rod.

19. The pop-up camera module of claim 13 wherein the side cover comprises a side which comprises a first slit and which is insertable into the base cover, and wherein the base cover comprises a second slit which is adjacent to the first slit, such that the first slit and the second slit collectively form a through-hole into which the FPCB inserts and through which the FPCB passes.

* * * * *